United States Patent [19]
Curtis

[11] 4,328,068
[45] May 4, 1982

[54] METHOD FOR END POINT DETECTION IN A PLASMA ETCHING PROCESS

[75] Inventor: Bernard J. Curtis, Gattikon, Switzerland

[73] Assignee: RCA Corporation, New York, N.Y.

[21] Appl. No.: 171,271

[22] Filed: Jul. 22, 1980

[51] Int. Cl.³ .................... B44C 1/22; C03C 15/00; C03C 25/06
[52] U.S. Cl. .................... 156/626; 156/345; 156/643; 156/646; 204/192 E; 204/298; 356/445
[58] Field of Search ............... 356/316, 326, 338, 346, 356/437, 445; 204/164, 192 EC, 192 E, 298; 250/531; 427/39, 10; 118/712, 620; 156/345, 626, 627, 643, 646

[56] References Cited
U.S. PATENT DOCUMENTS

| | | | |
|---|---|---|---|
| 4,136,951 | 1/1979 | Macourt | 356/36 |
| 4,245,154 | 1/1981 | Uehara et al. | 204/192 E X |
| 4,263,088 | 4/1981 | Gorin | 156/626 |
| 4,263,089 | 4/1981 | Keller | 204/192 E X |

OTHER PUBLICATIONS

Applied Spectroscopy, vol. 31, No. 1, 1977, Simple Optical Devices for Detection of Radiofrequency Oxygen Plasma Stripping of Photoresists by E. O. Degenkolb et al., pp. 40–42.
Solid State Technology, Feb. 1979, Plasma Etch Monitoring with Laser Interferometry by H. H. Busta et al., pp. 61–64.

Primary Examiner—William A. Powell
Attorney, Agent, or Firm—Birgit E. Morris; William J. Burke

[57] ABSTRACT

An improved plasma etching apparatus having a light pipe inserted through the chamber wall for coupling light emitted by different chemical species out of the chamber. The light pipe collects the emission directly or after reflection from the coated surface of a substrate. Stabilization of the intensity of the collected emission is indicative of the end point of the etching process.

The invention includes a method for detecting the end point of the etching process by monitoring the intensity of light emitted by a component of a gas contained in the chamber which passes out of the chamber through the light pipe. The light may be coupled directly into the light pipe or the light pipe may be so positioned as to detect the emitted light after it is reflected from the surface of the substrate. The intensity of the light is monitored until it stabilizes, indicating that the etching process is complete.

1 Claim, 4 Drawing Figures

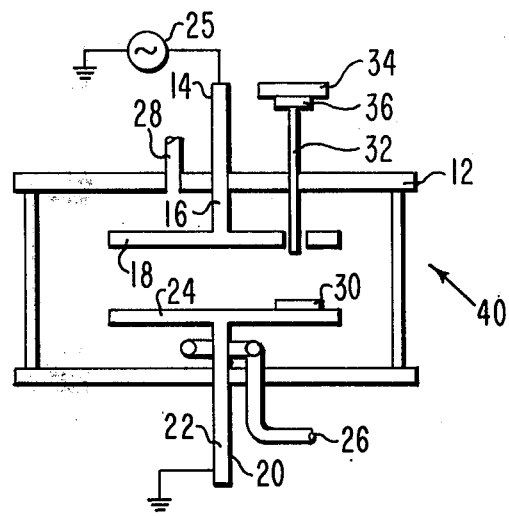
Fig. 3
Fig. 4
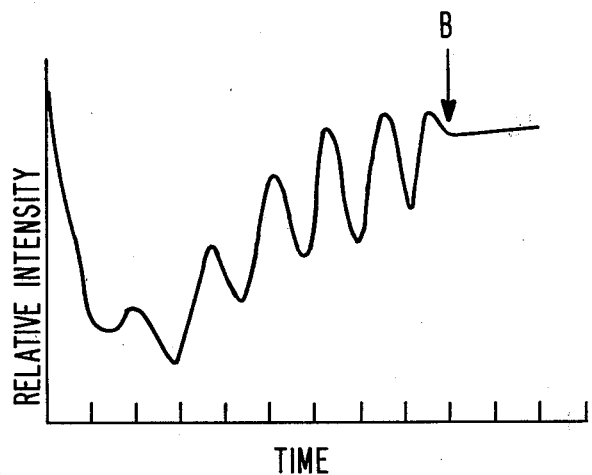

METHOD FOR END POINT DETECTION IN A PLASMA ETCHING PROCESS

This invention relates to an improved plasma etching apparatus and method for determining the end point of the etching process. The improvement comprises an optical apparatus for the detection of the end point of the etching process.

BACKGROUND OF THE INVENTION

Plasma etching is replacing standard wet chemical etching methods in integrated circuit and thin film device processing because of the sharper edge definition and lower cost obtainable. Plasma etching is typically used to delineate fine line patterns in thin films of insulators such as $SiO_2$ or $Si_3N_4$ or metals such as Al or Cr on substrates such as Si or glass by removal of portions of the coating in a plasma discharge. The coated substrate is placed in a plasma chamber into which an inert gas is flowed at reduced pressure. In the presence of a plasma discharge, reactive species are generated from the inert gas by processes such as dissociative or impact ionization. The removal of the coating occurs by chemical reaction between the reactive species and the coating as well as by bombardment of the coating by ions present in the plasma. The gaseous reaction products formed by chemical reactions and ion bombardment of the coating are continuously removed from the chamber using a vacuum pump.

It is important that etching be terminated as soon as the desired pattern is properly defined since overetching causes undercutting of the etch mask; thus altering the dimensions of the desired pattern as well as attacking the substrate itself. Methods to control the etching process include monitoring the concentration of a reactive species or a reaction product in the plasma or monitoring the reflectivity of the surface of a substrate, such as a silicon wafer, to determine the end point, i.e., the point at which the coating material is removed, exposing the substrate.

Degenkolb et al, in Applied Spectroscopy 31, 40 (1977), have disclosed a plasma chamber with a window through which light emitted by different chemical species in the plasma passes. A wavelength selective light detector is positioned outside the window to measure the time dependent relative concentration of a particular species. In this approach, the concentration of a reactive species, as measured by the intensity of its optical emission, will decrease as it is used up in the etching process and then return to about its initial concentration when the etching process is complete. The intensity of the emission from a reaction product, on the other hand, will increase as more of it is produced during etching and then decrease when the etching process is complete.

Busta et al, in Industrial Research and Development, June 1978 at page 133, have also disclosed a plasma chamber with a window. A light source and detector positioned outside the window are used to monitor changes in the reflectivity of the surface of a substrate situated within the chamber. A change from one reflectivity value to another will indicate that a coating layer has been removed from the substrate.

SUMMARY OF THE INVENTION

The invention is an improved plasma etching apparatus and a method for determining the end point of the plasma etching process. The improvement comprises mounting a light pipe extending from outside a plasma chamber through its wall and into the interior of the reactor. The light pipe may be positioned such that light emitted by a component of the plasma and reflected from the surface of a substrate passes into the light pipe. A light detector is positioned outsie the reactor to monitor the intensity of light passing out of the light pipe.

In the method of the invention, the emission of a component of the plasma is used as a light source which is monitored directly or is used as a source of light for monitoring the reflected light from the surface of the substrate.

BRIEF DESCRIPTION OF THE DRAWINGS

FIG. 3 is a schematic illustration of a cross-sectional view of a plasma etching apparatus having a light pipe mounted therein for monitoring the reflection from the surface of a substrate.

FIG. 4 is a graphical illustration of the time dependence of the intensity of light emitted by a component of a gas contained in the chamber and reflected from the surface of a coated substrate situated in the chamber.

DETAILED DESCRIPTION OF THE INVENTION

Figure 1:
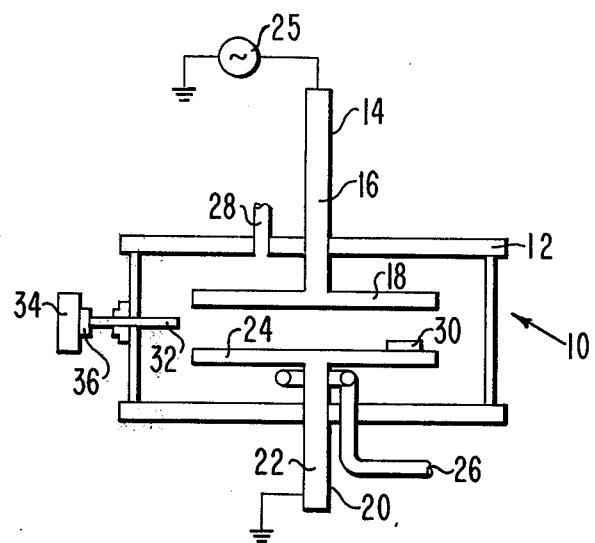
FIG. 1 is a schematic illustration of a cross-sectional view of a plasma etching apparatus having a light pipe mounted therein.

Referring to FIG. 1, a plasma etching apparatus 10 comprises a chamber 12 having a first electrode 14 which may be comprised of a stem 16 and a plate 18 and a second electrode 20 which may be comprised of a stem 22 and a plate 24, inserted through the walls thereof. Preferably, one of these electrodes is electrically isolated from the reactor wall and the second electrode is electrically connected to the reactor wall and is grounded. In the FIGURE, the electrodes are shown connected to an electrical power source 25, preferably a radio frequency power source. Reactive gas inlet port 26 and reaction product outlet port 28 extend through the walls of the chamber 12 to permit the flow of a reactive gas into the chamber and the removal of reaction products from the chamber by means of a vacuum pump connected to the outlet port 28 (not shown)

With a reactive gas flowing into the chamber 12 a plasma discharge can be initiated in the gas between the plates 18 and 24 using electrical power supplied by the power source 25. A substrate 30 having a coating thereon may be positioned in the discharge. Reactive chemical species created by the discharge interact with the coating, causing removal of the coating and producing a reaction product species which is removed from the chamber through the outlet port 28.

A light pipe 32 extends through the wall of the chamber 12 from outside to within the chamber. A portion of the light emitted by the reactive gas and reaction product species passes into the light pipe 32. A light detector 34 is positioned outside the chamber to detect the light which passes out of the light pipe 32. A wavelength band-pass filter 36, such as an interference filter or a spectrograph, is positioned between the end of the light pipe 32 and the light detector 34 to transmit only a selected band of wavelengths to the light detector 34. In this way, the intensity of the light emitted at a characteristic wavelength of a particular chemical species, and thus its relative concentration, can be monitored.

Figure 2:
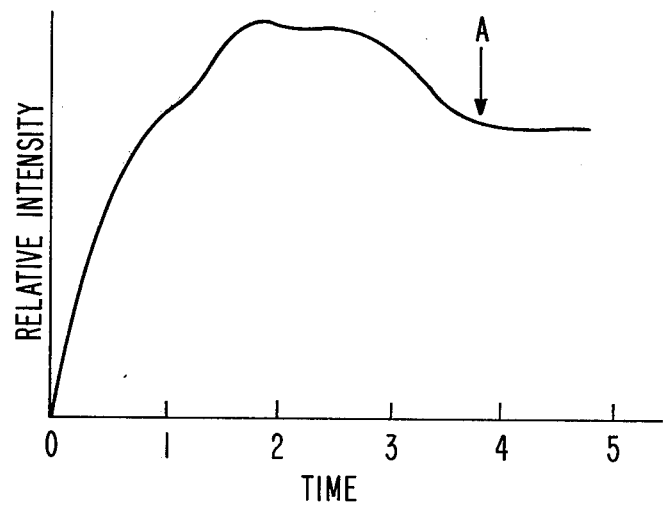
FIG. 2 is a graphical illustration of the time dependence of the concentration of a component of gas contained in the chamber during the etching process.

FIG. 2 shows the time dependence of the $N_2$ emission at 357.8 nanometers during the plasma etching of $Si_3N_4$ film on an oxidized surface of a Si wafer in a plasma generated in a gaseous mixture of $CF_4$ and $O_2$. The intensity of the emission due to $N_2$ builds up as the etching proceeds and then stabilizes beginning at the point marked A in the FIGURE indicating the end point of the etching. The intensity does not go to zero due to the $N_2$ background of the system and impurities in the gaseous mixture.

Referring to FIG. 3, the identification of the elements of the plasma chamber 40 is the same as that for the plasma chamber 10 shown in FIG. 1. The light pipe 32 is positioned in the plasma chamber 40 to collect light reflected from the surface of the substrate 30. Typically the light pipe extends through an opening opposed to the plate upon which the substrate is mounted. The positioning of the end of the light pipe 32 within the chamber 12 is not critical but it should not be positioned too close to the substrate, since it will then interfere with the plasma etching. For example, I have found that, for a 26 millimeter diameter substrate, a spacing between the electrode plates of 20 millimeters and a light pipe diameter of 6 millimeters is suitable.

In operation the plasma etching apparatus 40 utilizes a portion of the light emitted by a chemical species present in the plasma discharge as a light source. The intensity of light reflected from the coated surface of the substrate and passing into the light pipe will depend upon the nature and thickness of the coating. When the coating layer has been removed in the etching process, the intensity of the reflected light will become constant, dependent only upon the reflectivity of the uncoated surface of the substrate.

FIG. 4 shows the time dependence of the light intensity, reflected from a transparent $Si_3N_4$ film and etched under the same conditions as those of FIG. 2. The light passes into the light pipe and is transmitted through a band-pass filter centered at 357.8 nanometers. The light intensity gradually increases and then stabilizes beginning at the point B, corresponding to the end point of the etching or removal of the coating. The oscillations in the curve with increasing time correspond to interference effects in the coating which change as the thickness of the coating decreases. The appearance of this oscillatory behavior is indicative of the fact that I am, in actuality, observing a reflection of the coated surface of the substrate.

A method for measuring the end point of the plasma etching process on a coated substrate using light generated by the plasma itself as the light source comprises the steps of:

(a) mounting a light pipe in the wall of a plasma chamber having reactive gas inlet and outlet ports and two electrodes, which light pipe extends from outside to within the chamber and is positioned such that light emitted by a component of a gas contained in the chamber passes into the light pipe;

(b) positioning a substrate having a coating thereon, a portion of which is to be removed by plasma etching, in the plasma chamber;

(c) positioning a light detector and a narrow band filter to detect light of a certain wavelength which passes through the light pipe;

(d) flowing a reactive gas into the plasma chamber;

(e) initiating a plasma discharge in the reactive gas;

(f) monitoring the intensity of the light passing out of the light pipe to determine the point at which the intensity of the light beam stabilizes; and (g) stopping the plasma discharge.

The method may further include the step of reflecting the light emitted by a component of the gas contained in the chamber from the coated surface of the substrate before it enters the light pipe.

We claim:

1. In a method for measuring the end point of a plasma etching process comprising mounting a light pipe in the wall of a plasma chamber, which light pipe extends from outside to within the chamber, positioning a substrate having a coating thereon, a portion of which is to be removed by plasma etching, in the chamber, positioning a light detector and a wavelength bandpass filter so as to detect light of a certain wavelength passing through the light pipe, flowing a reactive gas into the plasma chamber, initiating a plasma discharge in the reactive gas, monitoring the intensity of the light passing through the light pipe until the intensity stabilizes, and terminating the plasma discharge; the improvement comprising positioning the end of the light pipe within the chamber so that light of said wavelength emitted by a chemical species present in the plasma discharge is reflected from the coated surface of the substrate before passing into the end of the light pipe.

* * * * *